(12) United States Patent
Taniyama et al.

(10) Patent No.: US 6,276,378 B1
(45) Date of Patent: Aug. 21, 2001

(54) APPARATUS FOR CLEANING BOTH SIDES OF SUBSTRATE

(75) Inventors: Hiroki Taniyama, Tosu; Toshikazu Arihisa, Kurume, both of (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/638,511

(22) Filed: Aug. 11, 2000

Related U.S. Application Data

(62) Division of application No. 09/135,478, filed on Aug. 17, 1998, now Pat. No. 6,115,867.

(30) Foreign Application Priority Data

Aug. 18, 1997 (JP) .................................................... 9-236531
Mar. 16, 1998 (JP) .................................................. 10-084919

(51) Int. Cl.[7] .................................................. B08B 3/02
(52) U.S. Cl. ......................................... 134/153; 134/902
(58) Field of Search .................................. 134/902, 144, 134/153; 15/77, 88.1, 88.2

(56) References Cited

U.S. PATENT DOCUMENTS

| | | |
|---|---|---|
| 4,985,722 | 1/1991 | Ushjima et al. . |
| 5,061,144 | 10/1991 | Akimoto et al. . |
| 5,081,733 | 1/1992 | Kudo . |
| 5,092,011 | 3/1992 | Gommori et al. . |
| 5,144,711 | 9/1992 | Gill, Jr. . |
| 5,213,118 | 5/1993 | Kamikawa . |
| 5,226,437 | 7/1993 | Kamikawa . |
| 5,236,515 | 8/1993 | Ueno et al. . |
| 5,261,431 | 11/1993 | Ueno et al. . |
| 5,278,821 | 1/1994 | Kawamura et al. . |
| 5,282,289 | 2/1994 | Hasegawa et al. . |
| 5,297,910 | 3/1994 | Yoshioka et al. . |
| 5,327,921 | 7/1994 | Mokuo et al. . |
| 5,339,539 | 8/1994 | Shiraishi et al. . |
| 5,345,639 | 9/1994 | Tanoue et al. . |
| 5,370,142 | 12/1994 | Nishi et al. . |
| 5,485,644 | 1/1996 | Shinbara et al. . |
| 5,498,294 | 3/1996 | Matsushita et al. . |
| 5,503,171 | 4/1996 | Yokomizo et al. . |
| 5,509,464 | 4/1996 | Turner et al. . |
| 5,518,542 | 5/1996 | Matsukawa et al. . |
| 5,520,744 | 5/1996 | Fujikawa et al. . |
| 5,626,675 | 5/1997 | Sakamoto et al. . |
| 5,651,160 | 7/1997 | Yonemizu et al. ................ 15/77 X |
| 5,730,162 | 3/1998 | Shindo et al. . |
| 5,927,305 | 7/1999 | Shiba . |

FOREIGN PATENT DOCUMENTS

| | | |
|---|---|---|
| 98 11 5398 | 10/2000 | (EP) . |
| 58-61632 | 4/1983 | (JP) . |
| 58-66333 | 4/1983 | (JP) . |
| 61-16528 | 1/1986 | (JP) . |
| 61-48258 | 10/1986 | (JP) . |
| 62-136825 | 6/1987 | (JP) . |
| 62-47153 | 10/1987 | (JP) . |

(List continued on next page.)

OTHER PUBLICATIONS

Patent Abstract of Japan, JP Publication No. 10–112453 dated Apr. 28, 1998.

*Primary Examiner*—Philip R. Coe
(74) *Attorney, Agent, or Firm*—Morrison & Foerster

(57) ABSTRACT

An apparatus for cleaning both sides of a substrate, incorporating a spin chuck for holding a substrate such that contact with at least a central portion of the substrate is prevented, a motor having a hollow shaft connected to the spin chuck to transmit rotating force to the spin chuck, a front-side cleaning mechanism for cleaning a surface of the substrate held by the spin chuck, and a back-side cleaning mechanism for rinsing a back side of the substrate held by the spin chuck, wherein the back-side cleaning mechanism is disposed to face the back side of the substrate held by the spin chuck through hollow portions of the hollow shaft.

6 Claims, 13 Drawing Sheets

FOREIGN PATENT DOCUMENTS

| | | |
|---|---|---|
| 62-252147 | 11/1987 | (JP) . |
| 63-185029 | 7/1988 | (JP) . |
| 64-57624 | 3/1989 | (JP) . |
| 64-81230 | 3/1989 | (JP) . |
| 1-120828 | 5/1989 | (JP) . |
| 1-38721 | 5/1989 | (JP) . |
| 1-184926 | 7/1989 | (JP) . |
| 2-130827 | 5/1990 | (JP) . |
| 3-52226 | 3/1991 | (JP) . |
| 3-52228 | 3/1991 | (JP) . |
| 3-116731 | 5/1991 | (JP) . |
| 4-15920 | 1/1992 | (JP) . |
| 4-56321 | 2/1992 | (JP) . |
| 4-14494 | 3/1992 | (JP) . |
| 4-130724 | 5/1992 | (JP) . |
| 4-196531 | 7/1992 | (JP) . |
| 4-304652 | 10/1992 | (JP) . |
| 4-332129 | 11/1992 | (JP) . |
| 5-36814 | 2/1993 | (JP) . |
| 5-36815 | 2/1993 | (JP) . |
| 5-121361 | 5/1993 | (JP) . |
| 5-182946 | 7/1993 | (JP) . |
| 5-53241 | 7/1993 | (JP) . |
| 5-326476 | 12/1993 | (JP) . |
| 6-204201 | 7/1994 | (JP) . |
| 9-148295 | 6/1997 | (JP) . |
| 9-289186 | 11/1997 | (JP) . |

US 6,276,378 B1

APPARATUS FOR CLEANING BOTH SIDES OF SUBSTRATE

This is a divisional of application Ser. No. 09/135,478 filed Aug. 17, 1998, and now U.S. Pat. No. 6,115,867, which application is incorporated by reference in its entirety.

BACKGROUND OF THE INVENTION

The present invention relates to an apparatus for cleaning both sides of substrates, such as LCD substrates or semiconductor wafers.

In a process for manufacturing semiconductor devices, both sides of semiconductor wafers must be cleaned. Therefore, contamination, such as particles, organic contaminants and metal impurity, allowed to adhere to the both sides of the wafers must be removed. To remove contamination from the both sides of the semiconductor wafers, a single wafer type apparatus for cleaning both sides of semiconductor wafers has been employed with which semiconductor wafers are sequentially processed.

As the apparatus for cleaning both surfaces of semiconductor wafer, there are apparatuses of two types, i.e., a reversing type wherein the front-side and the back-side surfaces of wafer are cleaned independently, and a non-reversing type wherein both-side surfaces are cleaned simultaneously.

Since the apparatus of the reversing type (the former) is provided with a reversing unit for reversing the wafer W in addition to the cleaning unit, it becomes large-sized and has low throughput.

As shown in FIG. 1, a conventional apparatus 100 for cleaning both sides of wafers incorporates a cup 108 disposed in a case 109, a spin chuck 101, a motor 102, a back-side cleaning mechanism 106 and a front-side cleaning mechanism (not shown). The spin chuck 101 is connected to a rotational drive shaft 103 of the motor 102, the spin chuck 101 incorporating four support arms 104 radially extending from the center of rotation of the spin chuck 101 and holding members 105. Each of the holding members 105 is joined to the leading end of each of the support arms 104. The foregoing holding members 105 are brought into contact with an outer end of a wafer W so as to horizontally hold the wafer W. The back-side cleaning mechanism 106 is disposed below the spin chuck 101. The back-side cleaning mechanism 106 has a nozzle 107 for discharging and supplying process liquid to the back side of the wafer W.

As shown in FIG. 2, the nozzle 107 supplies the process liquid to the back side of the wafer W through a space 110 between the support arms 104 of the spin chuck 101. However, a gas-liquid interface is undesirably generated on the back side of the wafer W on which the supply of the process liquid to the same is obstructed by the support arms 104. Thus, the back side of the wafer W cannot sufficiently be rinsed. What is worse, foreign matter, such as particles, can easily be allowed to adhere to the portion in the vicinity of the gas-liquid interface. Thus, there is apprehension that the back side of the wafer W is contaminated. Moreover, the rotating support arms 104 reject the process liquid, thus causing a great quantity of the process liquid to be consumed wastefully. Thus, the running cost is enlarged excessively.

As a conventional apparatus of another type, an apparatus 120 for rinsing two sides of wafers is known, the apparatus 120 incorporating a nozzle 126 structured as shown in FIG. 3. A rotational table 124 arranged to be rotated by a rotating mechanism 130 is disposed in a cup 121 of the apparatus 120. A nozzle 126 is disposed to face a central portion of the back side of a wafer W held by the rotational table 124. The rotating mechanism 130 is provided with a motor 134, a driving pulley 133, an idle pulley, a belt 132, and a rotating shaft 123. The rotational driving force of the motor 134 is transmitted to the rotating shaft 123 through the belt 132. A supply pipe 125 of the nozzle 126 passes through a rotating shaft 123, and then the supply pipe 125 is allowed to communicate with a process liquid supply unit (not shown).

The process liquid splattered from the rotating wafer W generates a great quantity of splashes of the process liquid in the cup 121. On the other hand, particles are generated in the rotating mechanism 130. To prevent contamination of the wafer W, the communication between the processing atmosphere in the cup 121 and the atmosphere in the rotating mechanism 130 must be prevented.

However, a small gap 127 exists between the rotating shaft 123 and the cup 121. Therefore, fine dust generated in the rotating mechanism 130 is introduced from the rotating mechanism 130 into the cup 121 through the gap 127. Thus, the introduced dust is allowed to adhere to the back side of the wafer W. Splashes of the process liquid is introduced into the rotating mechanism 130 from the cup 121 through the small gap 127. Thus, the rotating mechanism 130 is contaminated. Since a small gap 128 exists in a portion in which the nozzle 126 projects over the rotational table 124, the process liquid is introduced into the supply pipe 125 through the gap 128. Thus, the rotating mechanism 122 disposed below the supply pipe 125 is contaminated. As a result, the rotating mechanism 130 easily produces trouble.

BRIEF SUMMARY OF THE INVENTION

An object of the present invention is to provide an apparatus for cleaning both sides of substrate with which contamination of the back side of the substrate can be prevented and which is able to improve the efficiency to clean the back side of the substrate, and which provides a high throughput and is small-sized.

Another object of the present invention is to provide an apparatus for cleaning both sides of substrates with which contamination of the back sides of the substrates can be prevented and a rotating mechanism of a spin chuck is not contaminated.

An apparatus for cleaning both sides of a substrate, comprising: a spin chuck for holding a substrate such that contact with at least a central portion of the substrate is prevented; rotating means having a hollow shaft connected to the spin chuck to transmit rotating force to the spin chuck; front-side cleaning means for cleaning a front side of the substrate held by the spin chuck; and back-side cleaning means for cleaning a back side of the substrate held by the spin chuck, wherein the back-side cleaning means is disposed to face the back-side of the substrate held by the spin chuck through hollow portions of the hollow shaft.

An apparatus for cleaning both sides of a substrate, comprising: a rotational table having a holding portion for holding a substrate such that contact with at least a central portion of the substrate is prevented; a hollow rotating shaft connected to a lower portion of the rotational table and rotatively supporting the rotational table; front-side cleaning means for cleaning a front side of the substrate held by the rotational table; back-side cleaning means for cleaning the back side of the substrate held by the rotational table, the back-side cleaning means having a nozzle disposed to face the back side of the substrate held by the rotational table through a hollow portion of the rotating shaft; a process liquid supply unit for supplying process liquid to the nozzle;

a cover for covering the hollow rotating shaft; and a first sealing member for sealing a portion between the cover and the rotational table.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments give below, serve to explain the principles of the invention.

DETAILED DESCRIPTION OF THE INVENTION

Figure 1:
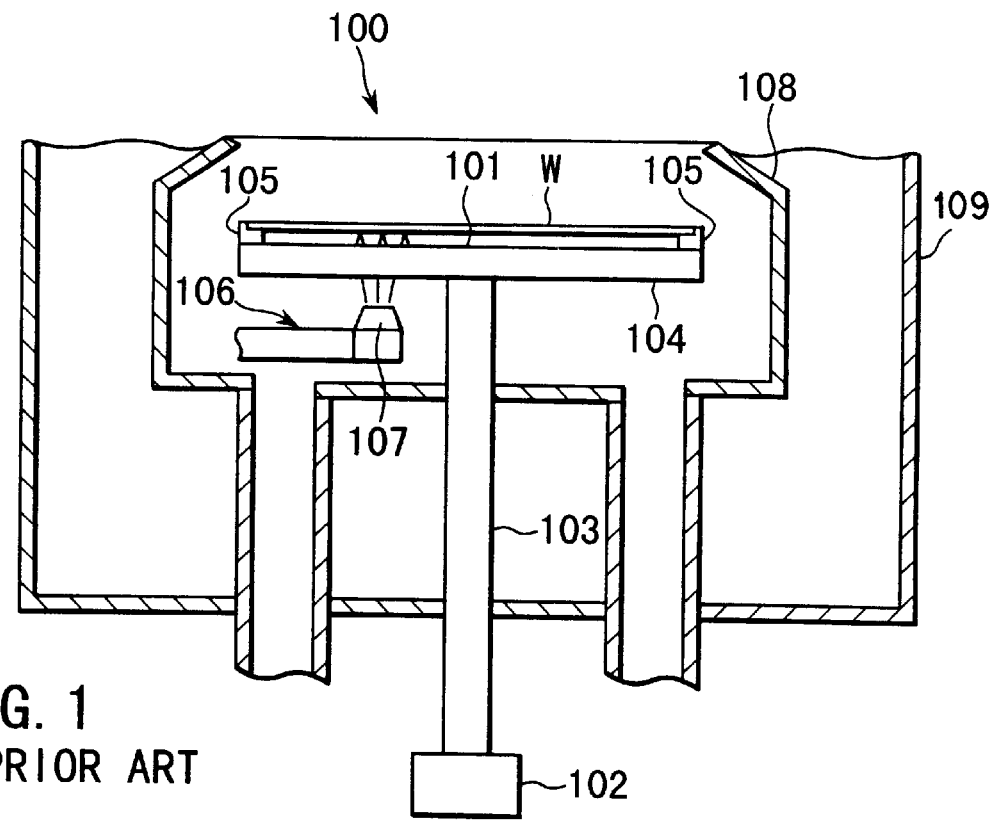
FIG. 1 is a perspective view schematically showing the inside portion of a conventional apparatus.
Figure 2:
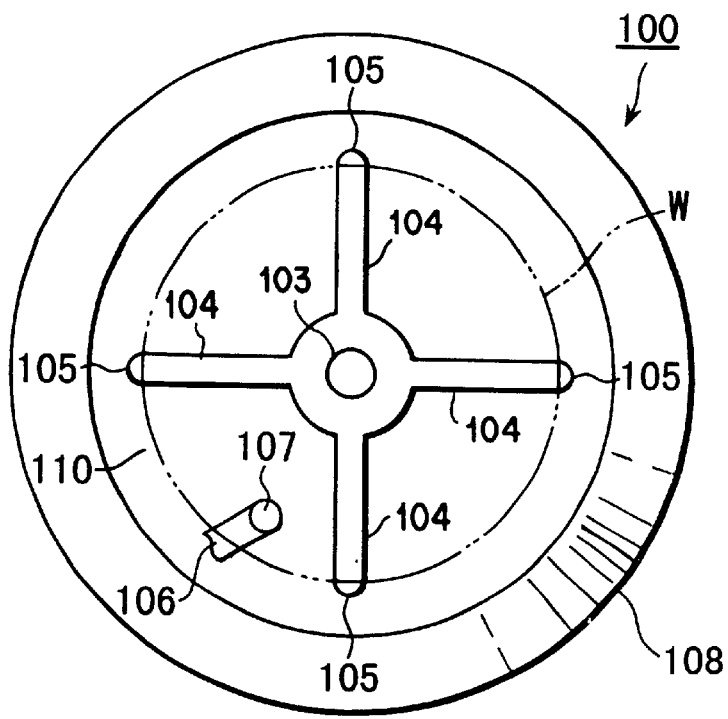
FIG. 2 is a plan view showing the conventional apparatus from a lower position.
Figure 3:
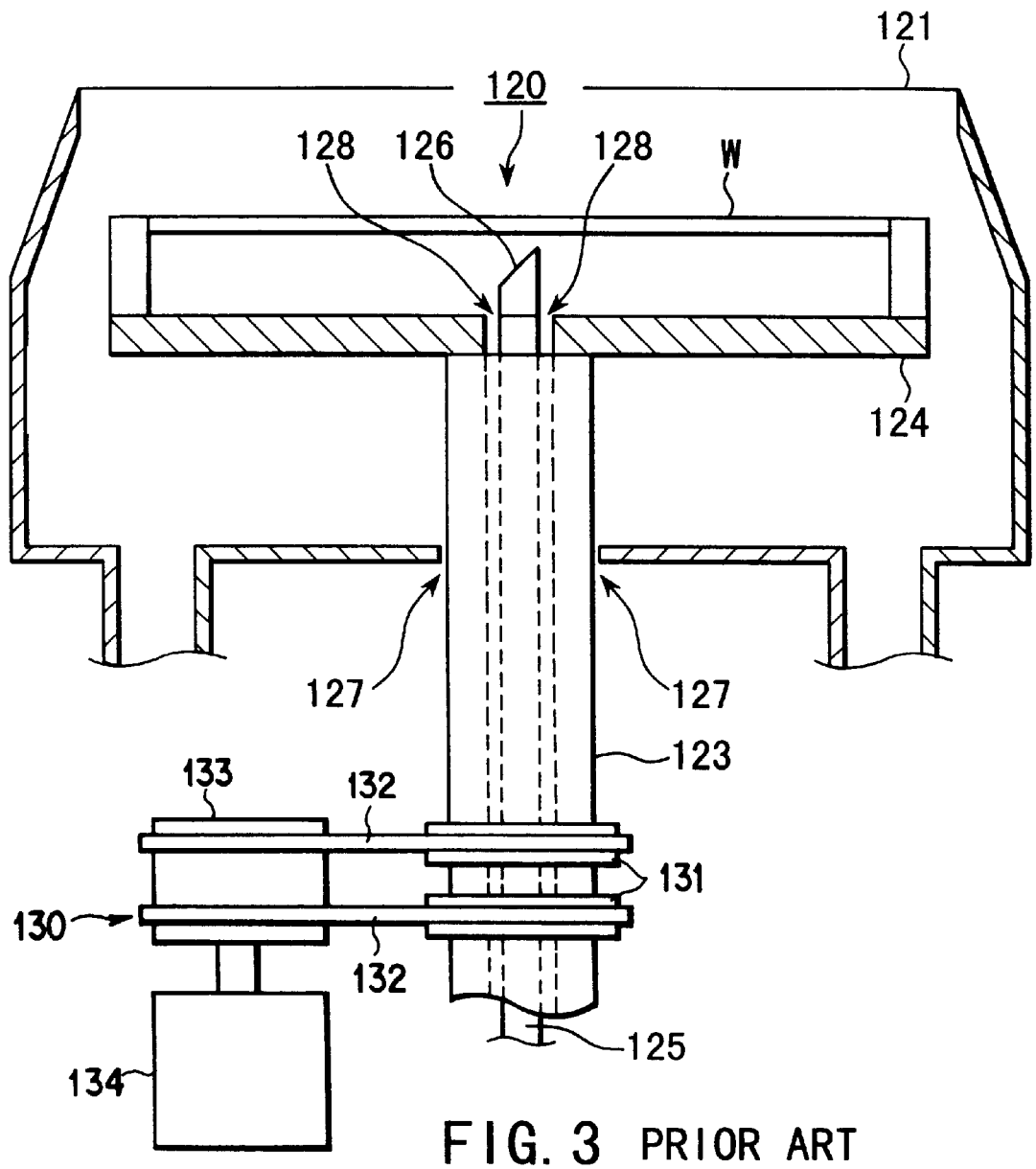
FIG. 3 is a perspective view schematically showing the inside portion of another conventional apparatus.

A variety of embodiments of the present invention will now be described with reference to the drawing.

A cleaning system 1 incorporates a loading/unloading portion 2 into which semiconductor wafers W in lot units including 25 semiconductor wafers W are introduced and from which the same are discharged with a cassette C. The loading/unloading portion 2 has a loading frame on which, for example, three cassettes C are placed. A first conveying portion 5 is formed along the loading frame. A first conveying-arm mechanism 3 is formed in the first conveying portion 5. The first conveying-arm mechanism 3 incorporates a plurality of holders 3a and 3b, a forward/reverse moving mechanism for moving forwards/reversely the holders 3a and 3b, an X-axis moving mechanism for moving the holders 3a and 3b in the direction of the X axis, a Z-axis moving mechanism for moving the holders 3a and 3b in the direction of the Z axis and a θ-swinging mechanism for rotating the holders 3a and 3b around the Z axis.

An introduction and buffer mechanism 11 is formed at an end of the first conveying portion 5, while a discharge and buffer mechanism 12 is formed at another end of the first conveying portion 5. The first conveying-arm mechanism 3 has the holder 3a joined to the lower portion thereof so as to sequentially take out the wafers W, which have not been rinsed, from the cassette C, and then the first conveying-arm mechanism 3 places the wafers W on the introduction and buffer mechanism 11. On the other hand, the first conveying-arm mechanism 3 has the holder 3b joined to the upper portion thereof for taking out the rinsed wafers W from the discharge and buffer mechanism 12 so as to sequentially introduce the wafers W into the cassette C.

A second conveying portion 10 is formed at a position adjacent to the first conveying portion 5. A second conveying-arm mechanism 8 is movably disposed in the second conveying portion 10. The second conveying-arm mechanism 8 incorporates a plurality of holders 8a, 8b and 8c, a forwards/reversely moving mechanism for forwards/reversely moving the holders 8a, 8b and 8c, an X-axis moving mechanism for moving the holders 8a, 8b and 8c in the direction of the X axis, a Z-axis moving mechanism for moving the holders 8a, 8b and 8c in the direction of the Z axis and a θ-swinging mechanism for rotating the holders 8a, 8b and 8c around the Z axis. The second conveying-arm mechanism 8 has the holder 8a joined to the lower portion thereof so as to sequentially take out the wafers W, which have not been rinsed, from the cassette C, and then the second conveying-arm mechanism 8 places the wafers W on the introduction and buffer mechanism 11. On the other hand, the holder 8b joined to the upper portion of the second conveying-arm mechanism 8 sequentially takes out the rinsed wafers W from the discharge and buffer mechanism 12 so as to sequentially introduce the wafers W into the cassette C.

A processing portion 6 is formed at a position adjacent to the second conveying portion 10. The processing portion 6 has a variety of processing units 13 to 18 for rinsing and drying the wafers W. The processing units 13 and 16 arranged to perform the same chemical solution process are disposed vertically. The processing units 14 and 17 arranged to perform the same chemical solution process are disposed vertically. The processing units 15 and 18 arranged to perform the same rinsing and drying processes are disposed vertically. A chemical solution supply unit 19 is disposed on the back of the processing units 13 to 18 so that chemical solutions for use to rinse the wafers W are supplied to the processing units 13 to 18.

The wafers W are taken out from the cassette C by the first conveying-arm mechanism 3, and then placed on the introduction and buffer mechanism 11 so as to be moved to the second conveying-arm mechanism 8. Then, the wafers W are moved to the processing units 13 to 18 of the processing portion 6. Initially, the wafers W are cleaned with process liquid included a chemical solution component in the processing unit 13. Then, the wafers W are rinsed with pure water, and then subjected to a drying process by using spin to remove pure water. Then, the wafers W are cleaned with process liquid included an another chemical solution component in the processing unit 14. Then, the wafers W are rinsed with pure water, and then subjected to a drying process by using spin to remove pure water. Then, wafers W are subjected to a final rinsing process with pure water in the processing unit 15. Then, the wafers W are subjected to a drying process by using spin to remove pure water. Also in each of the processing units 16 to 18, a similar process is performed.

Referring to FIGS. 6 to 16, the processing units 13 to 18 will now be described. Since the processing units 13 to 18 have the same structure, the processing unit 13 will now be described as a representative unit.

Figure 6:
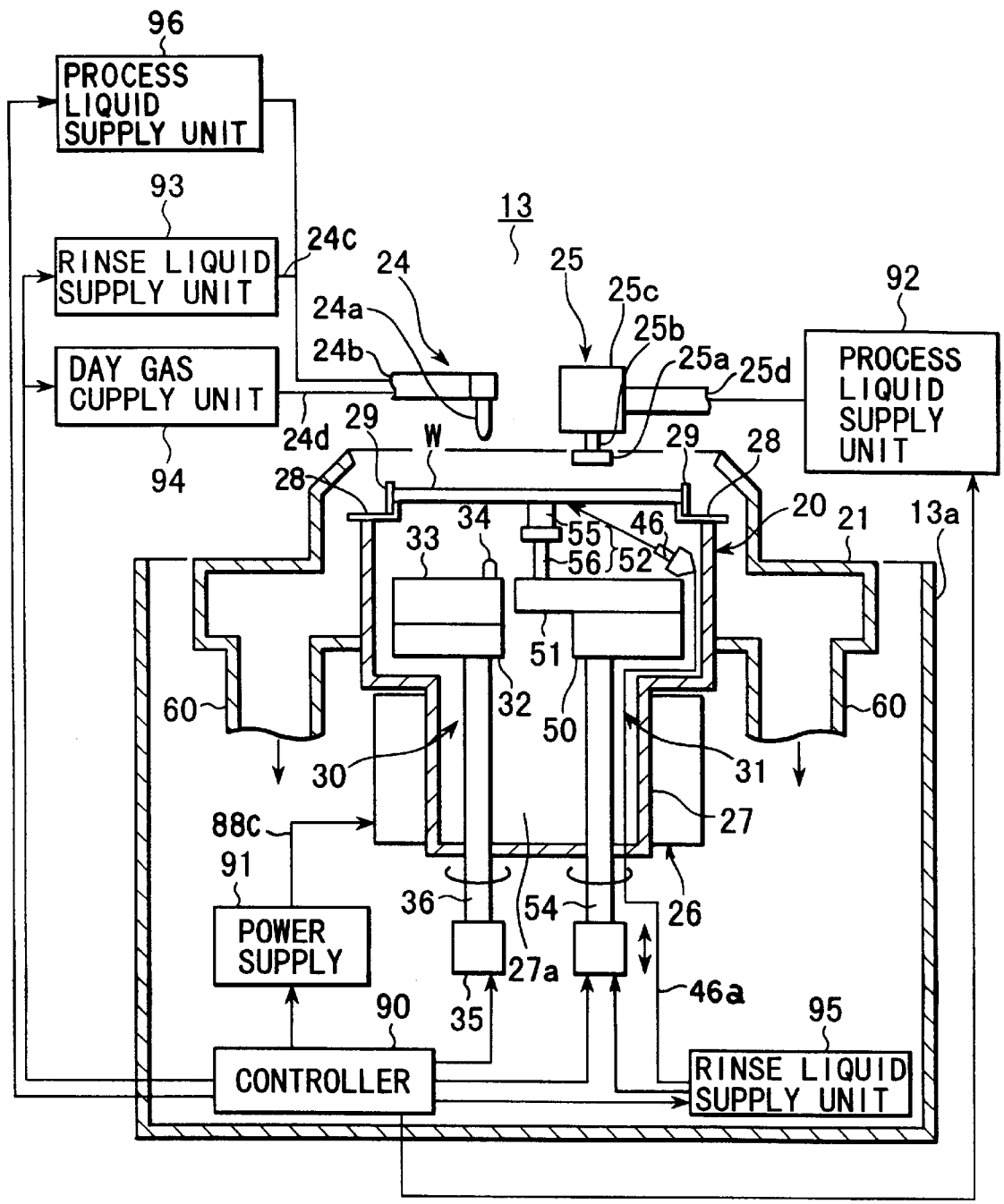
FIG. 6 is a cross sectional view showing a substrate cleaning apparatus according to an embodiment of the present invention.

As shown in FIG. 6, the processing unit 13 is an apparatus which is capable of cleaning both sides of wafers and which incorporates front-side cleaning mechanisms 24 and 25 and back-side cleaning mechanisms 30, 31 and 46. The processing unit 13 is completely surrounded by a casing 13a, In the casing 13a, a spin chuck 20, a cup 21, a variety of nozzle mechanisms 24, 30 and 46 and a variety of scrubbing (brush rinsing) mechanisms 25 and 31 are incorporated.

A nozzle 24a of the nozzle mechanism 24 is allowed to communicate with a process liquid supply unit 96 and a rinse liquid supply unit 93 through a supply line 24c, and is allowed to communicate with a dry-gas supply unit 94 through a supply line 24d. The supply lines 24c and 24d can be switched by a controller 90.

The front-side scrubbing mechanism 25 incorporates a rotational brush 25a, a tube 25b, a temperature adjusting portion 25c and a process liquid supply unit 92. The process liquid supply unit 92 accommodates a process liquid such as a pure water, the process liquid supply unit 92 being allowed to communicate with the tube 25b through a supply line 25d. The pure water is arranged to be supplied to the rotational brush 25a and the wafers W through the tube 25b.

The back-side scrubbing unit 25 incorporates a rotational brush 55, a tube 56 and a process liquid supply unit 92. The process liquid supply unit 92 accommodates the process liquid such as the pure water, the process liquid supply unit 92 being allowed to communicate with the tube 56 through the supply line 25d. The pure water is arranged to be supplied to the rotational brush 55 through the tube 56.

It should be noted that only one of the front-side scrubbing unit 25 and the nozzle mechanism 24 may provided as the front-side rinsing mechanism and only one of the back-side scrubbing unit 31 and the nozzle mechanism 30 may be provided as the reverse-side rinsing mechanism.

Further, in the scrubbing rinsing mechanism 25, 31, pure water can be supplied to the brushes 25a, 55, from other pure water supplying parts instead of supplying pure water from the brush 25a, 55.

Figure 8:
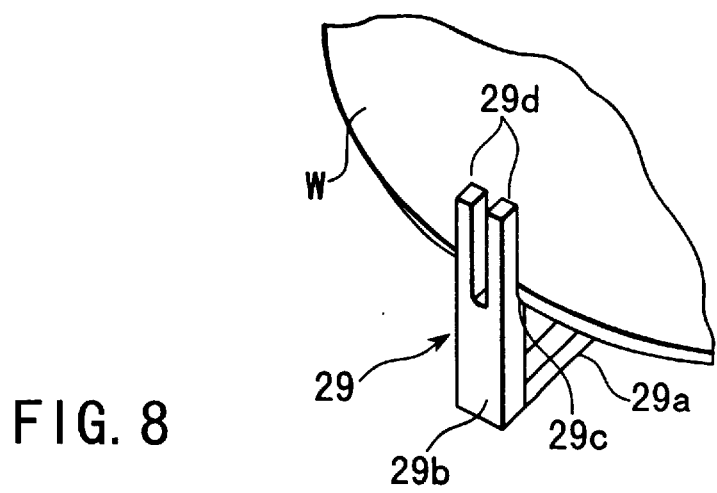
FIG. 8 is an enlarged perspective view showing a mechanical chuck.

The spin chuck 20 incorporates an annular loading plate 28 and a mechanical chucking member (a holding portion) 29 placed on the loading plate 28. The annular loading plate 28 is joined to the upper portion of a rotating shaft 27 of a motor 26. As shown in FIG. 8, the mechanical chucking member 29 incorporates a horizontal support portion 29a, a vertical portion 29b, a contact portion 29c and a guide portion 29d. The contact portion 29c is formed between the vertical portion 29b and the guide portion 29d so as to be brought into contact with an outer end of the wafer W so that the wafer W is positioned.

The rotating shaft 27 has a hollow portion 27a having two opened ends. The back-side cleaning nozzle 30, the back-side scrubbing unit 31 and the rinse nozzle 46 face the back side of the wafer W through the hollow portion 27a. The lower portion of the rotating shaft 27 is incorporated in the motor 26. Note that a structure may be employed in which a rotation transmission mechanism incorporating pulleys and a belt is joined to the rotating shaft 27 in place of the motor 26 so as to rotate the rotating shaft 27.

Figure 7:
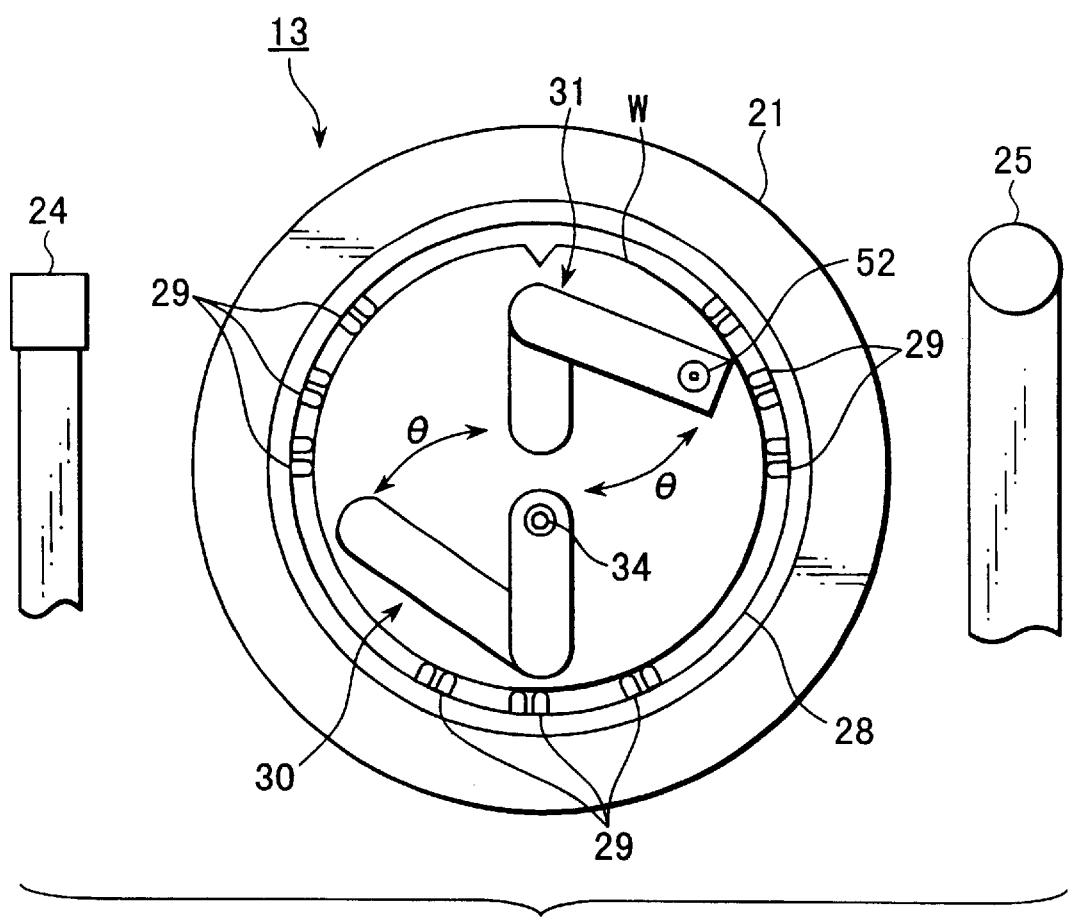
FIG. 7 is a plan view showing the substrate cleaning apparatus from an upper position.
Figure 9:
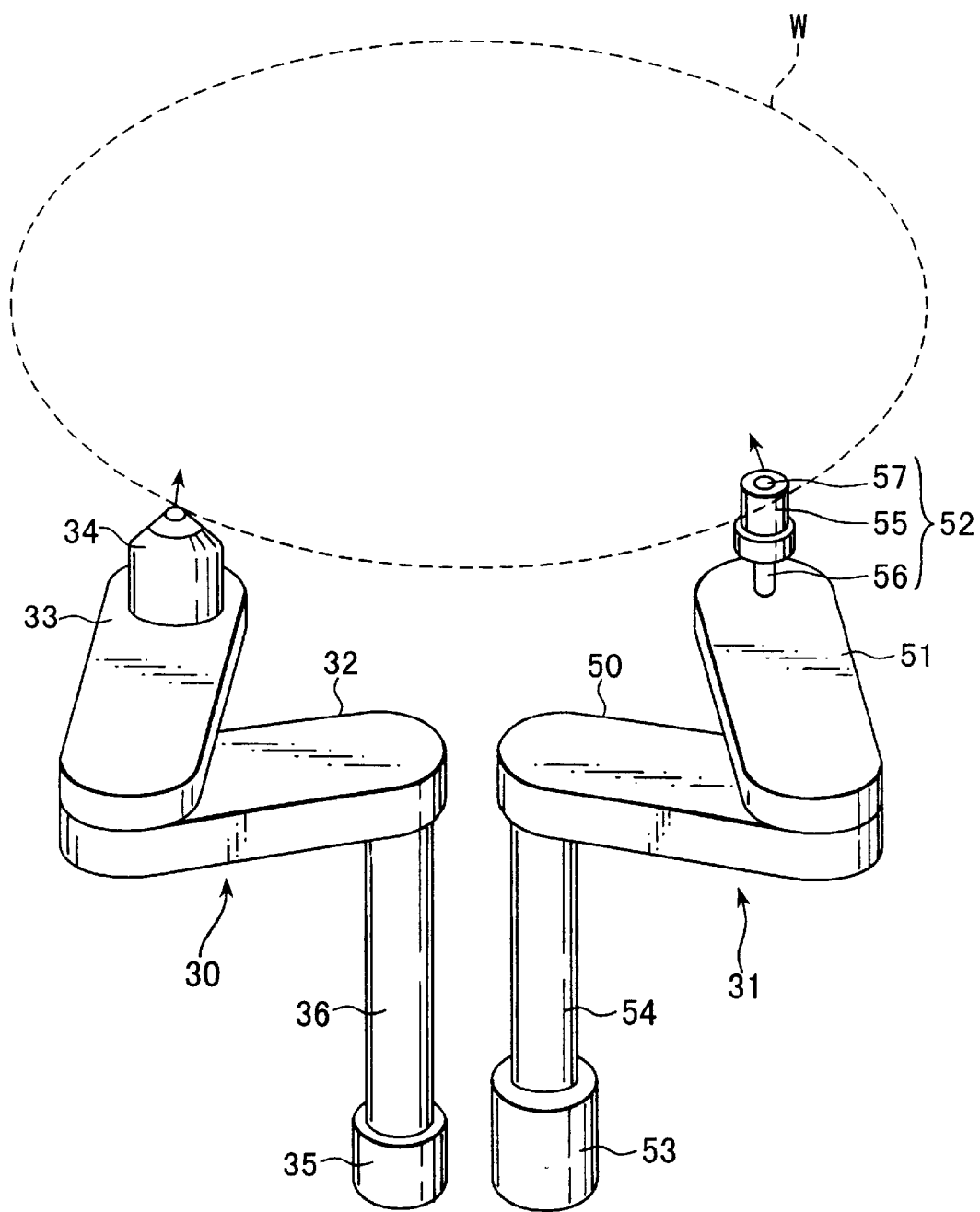
FIG. 9 is an exploded perspective view showing a jet nozzle mechanism and a scrubbing mechanism for cleaning the back side of a substrate.

As shown in FIG. 9, the back-side cleaning nozzle 30 is supported by a multiarticular arm robot having first and second arms 32 and 33. A water jet nozzle 34 facing upwards is joined to the leading end of the second arm 33. A main shaft 36 which is forwards/reversely rotated by the rotating force of the motor 35 is connected to the base portion of the first arm 32. When the rotation of the motor 35 is switched, the water jet nozzle 34 can be moved at least between the central portion of the back side of the wafer W and an arbitrary periphery of the wafer W as shown in FIG. 7.

Figure 10:
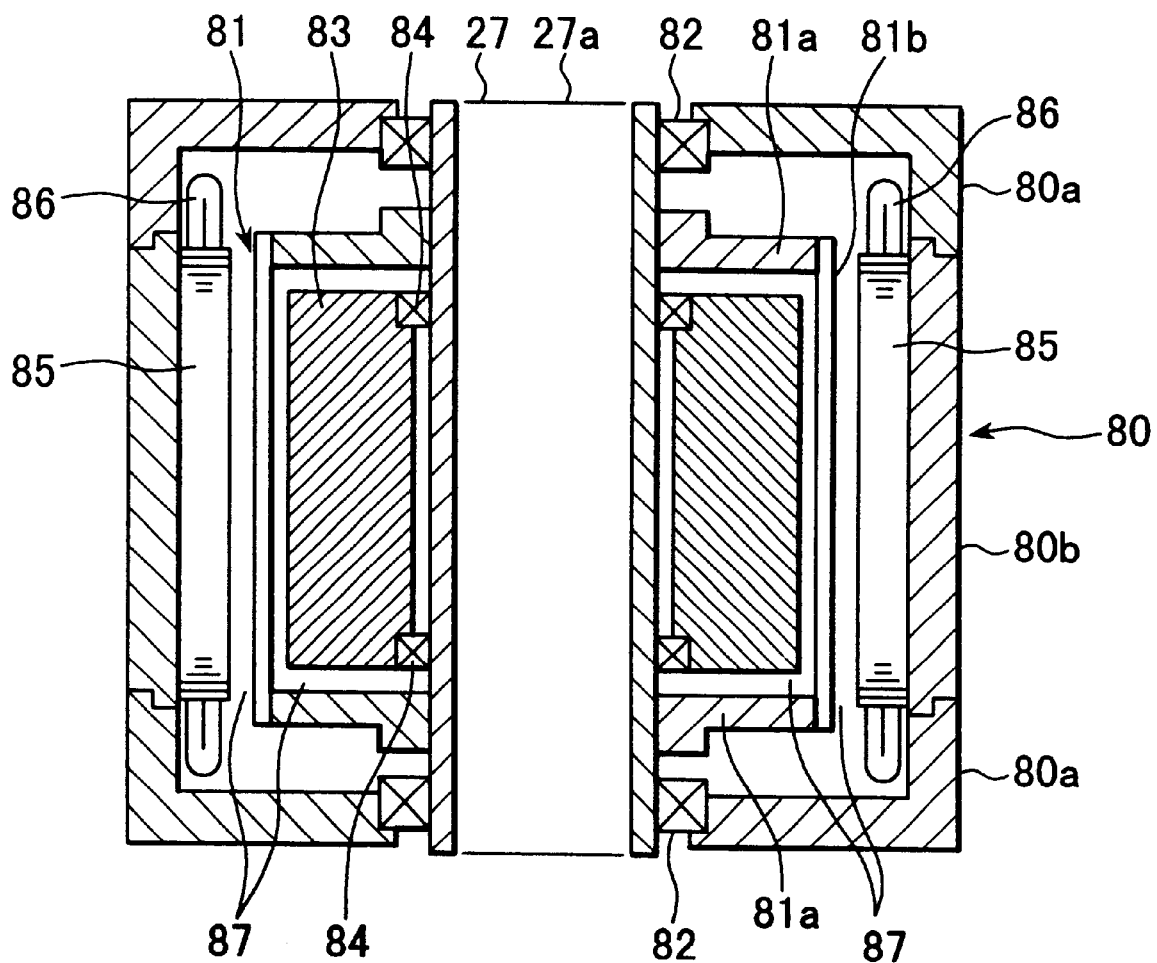
FIG. 10 is a cross sectional view showing the internal structure of a motor for the spin chuck.
Figure 11:
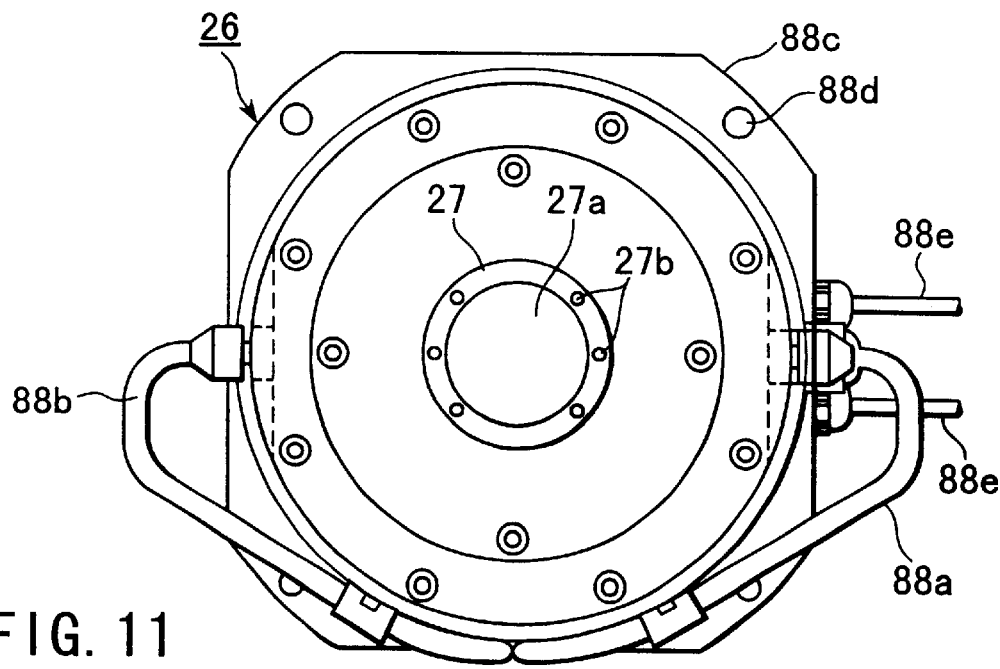
FIG. 11 is a diagram showing the shape of the motor for the spin chuck from an axial direction.
Figure 12:
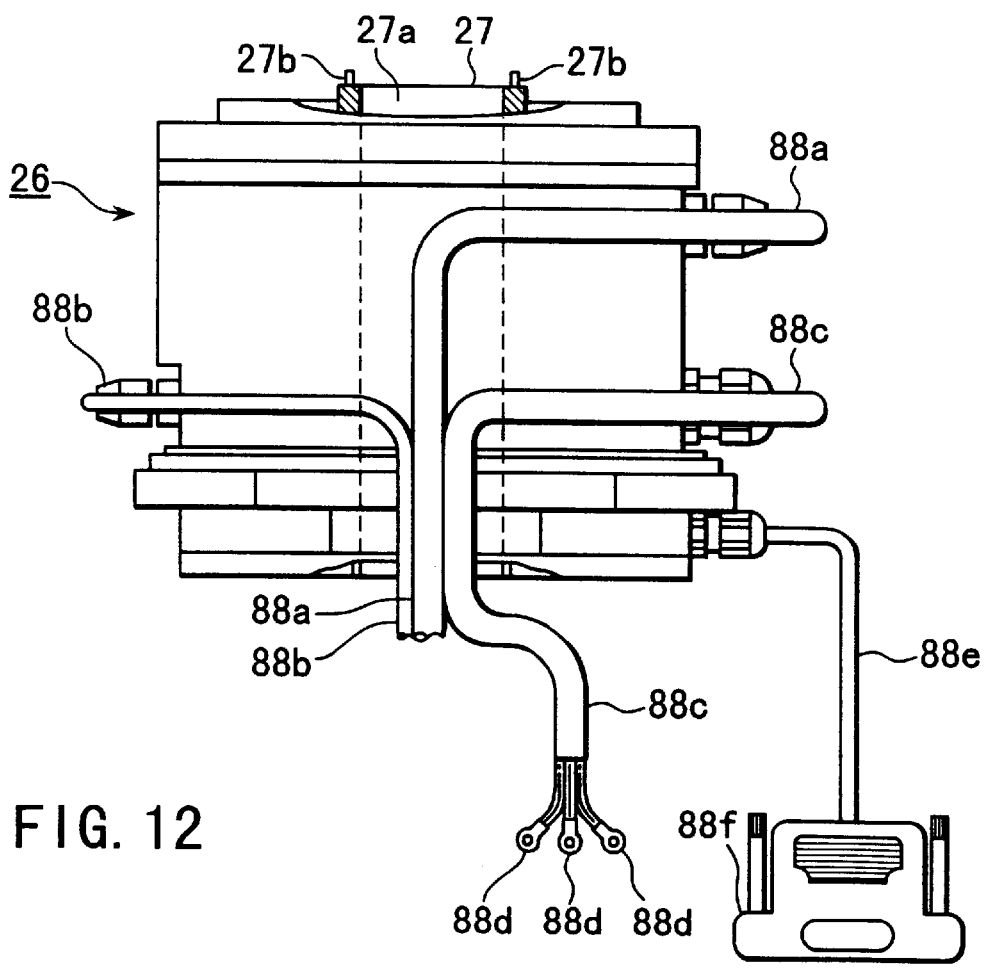
FIG. 12 is a diagram showing the shape of the motor for the spin chuck from a direction perpendicular to the axial direction.

Referring to FIGS. 10 to 12, the motor 26 for operating the spin chuck will now be described.

It is preferable that the motor 26 for rotating the spin chuck 20 is an AC servo motor of a sleeve rotor type structured as shown in FIG. 10. The motor 26 incorporates a stator 80 and a rotor 81 which has a hollow shaft 27 rotatively supported by the stator 80 through a pair of bearings 82.

The stator 80 incorporates a case, which has a pair of end brackets 80a and a stator frame 80b, a stator core 85 joined to the inner surface of the stator frame 80b and a stator winding 86 wound around the stator core 85. The stator core 85 is made of a conductor formed into a thin-wall cylinder. The stator winding 86 is connected to a power supply circuit of a power supply 91.

The rotor 81 incorporates the rotating shaft 27 having the hollow portion 27a, a cage portion incorporating a pair of end plates 81a and a plurality of connection rods 81b and a rotor core 83. The hollow portion 27a of the rotating shaft 27 provides a space (having an inner diameter of, for example, 51 mm) which is sufficiently large to accommodate a main shaft 36 of the back-side rinsing nozzle 30 and a main shaft 54 of the scrubbing unit 31.

The end plates 81a of the cage portion are secured to the outer surface of the rotating shaft 27. The rotor core 83 is disposed in the cage portion to face the stator core 85. Moreover, the rotor core 83 is rotatively joined to the rotating shaft 27 through a pair of bearings 84. The rotor core 83 is made of a conductor formed into a thin-wall cylinder.

The AC servo motor 26 of the foregoing type is able to considerably reduce a gap 87 between the rotor core 83 and the stator core 85. Therefore, a high torque efficiency (a great torque per unit input electric power) can be obtained. Since the motor 26 has excellent response when the rotational speed of the motor 26 is controlled, the rotational speed can smoothly be changed. When the chemical solution process is performed and when the scrubbing process is performed, the rotational speed of the motor 26 is controlled to a range from 100 rpm to 1000 rpm. When the spin drying process is performed, the rotational speed of the motor 26 is controlled to a range from 1500 rpm to 2000 rpm. Note that a maximum rotational speed of the motor 26 is 3000 rpm and a maximum acceleration of the same is 1000 rpm/second.

As shown in FIGS. 11 and 12, the motor 26 is secured to the casing 13a with a bolt inserted into a bolt hole 80d of a flange 80c. Tubes 88a and 88b are inserted into the motor 26 from side surfaces of the motor 26. The leading end of each of the tubes 88a and 88b is opened in the gap 87 in the motor 26. The base portion of the tube 88a is allowed to communicate with a suction portion of a vacuum exhaust pump (not shown) so that particles are sucked and removed from the gap 87 through the tube 88a. The base portion of the other tube 88b is allowed to communicate with an $N_2$-gas supply unit (not shown). Thus, $N_2$ gas can be supplied to the gap 87 through the tube 88b. As a result, the inside portion of the motor 26 is purged with the $N_2$ gas.

Cables 88c and 88e are inserted into the motor 26 from the side portions of the motor 26. The leading end of each of the cables 88c and 88e is connected to a circuit in the motor 26. A terminal 88d of the cable 88c is connected to a power supply 91 so that electric power is supplied from the power supply 91 to an operation circuit of the motor 26 through the cable 88c. The other cable 88e is connected to a detector (not shown) by a connector 88f. The detector has a sensor portion for detecting the rotational speed of the rotating shaft 27, the detector being connected to an input portion of the controller 90. When a detection signal is supplied from the detector to the controller 90, the rotational speed of the rotating shaft 27 is displayed on a display unit (not shown).

The end surface of the rotating shaft 27 is provided with a plurality of pins 27b. The pins 27b connect the rotating shaft 27 to another shaft member (not shown).

Figure 13:
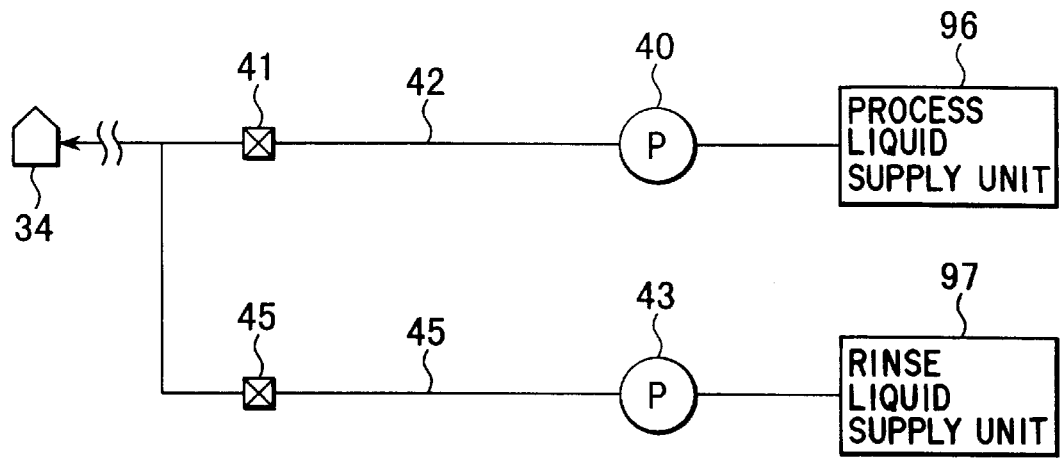
FIG. 13 is a circuit diagram showing a supply circuit for supplying cleaning liquid to the jet nozzle.

As shown in FIG. 13, a chemical solution supply circuit 42 and a pure water supply circuit 45 are allowed to communicate with the water jet nozzle 34 so that chemical solutions are supplied from a supply unit 96 to the water jet nozzle 34. Moreover, pure water is supplied from a supply unit 97 to the water jet nozzle 34. The chemical solution supply circuit 42 is provided with a pump 40 and an opening/closing valve 41, while the pure water supply circuit 45 is provided with a pump 43 and an opening/closing valve 45. The pumps 40 and 43 and the opening/closing valves 41 and 45 are controlled by the controller 90. Thus, the pressure of jet water flow jetted from the water jet nozzle 34 is controlled to, for example, 50 kg/cm$^2$ to 100 kg/cm$^2$.

Figure 4:
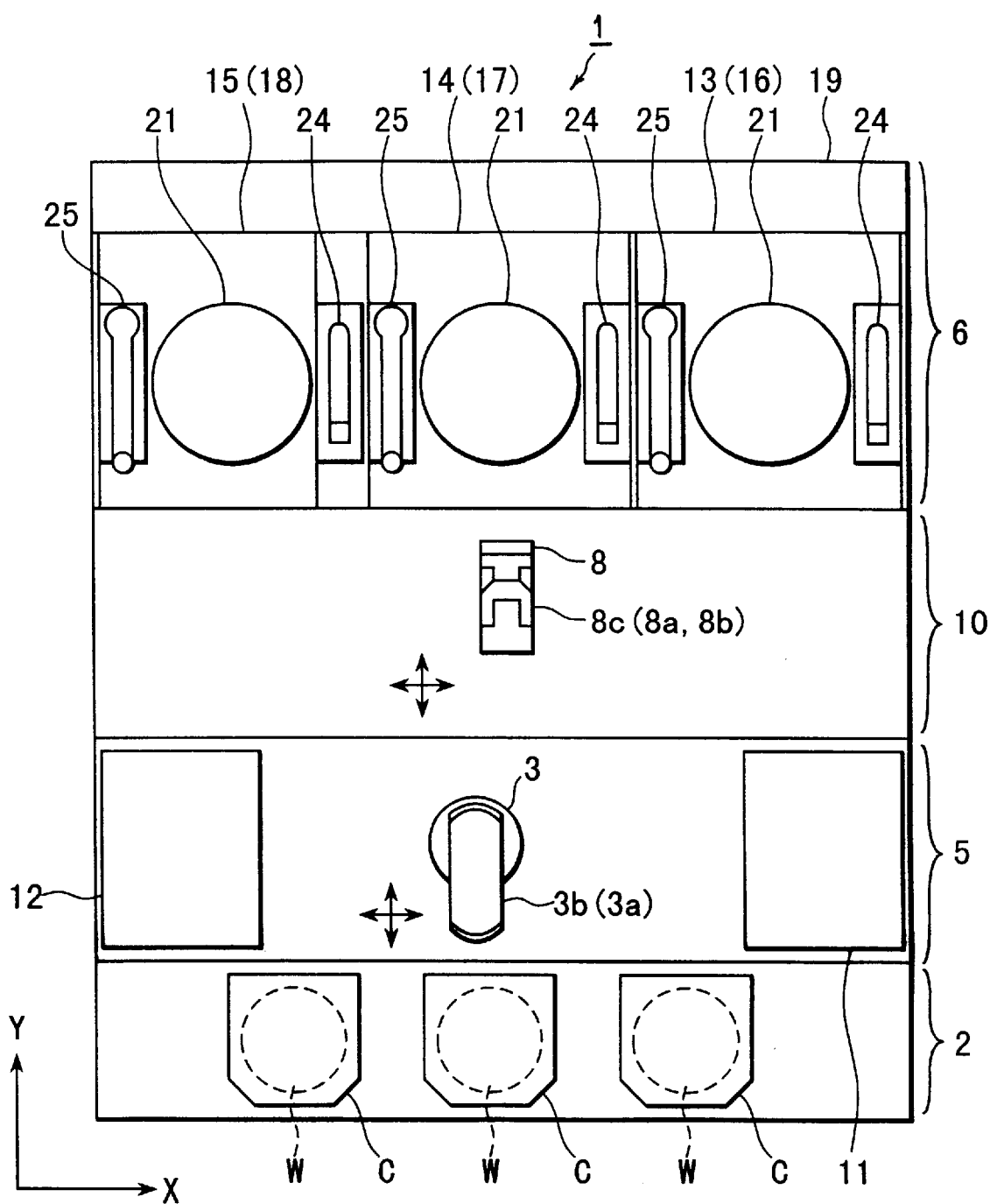
FIG. 4 is a plan view showing the layout of a cleaning system.
Figure 5:
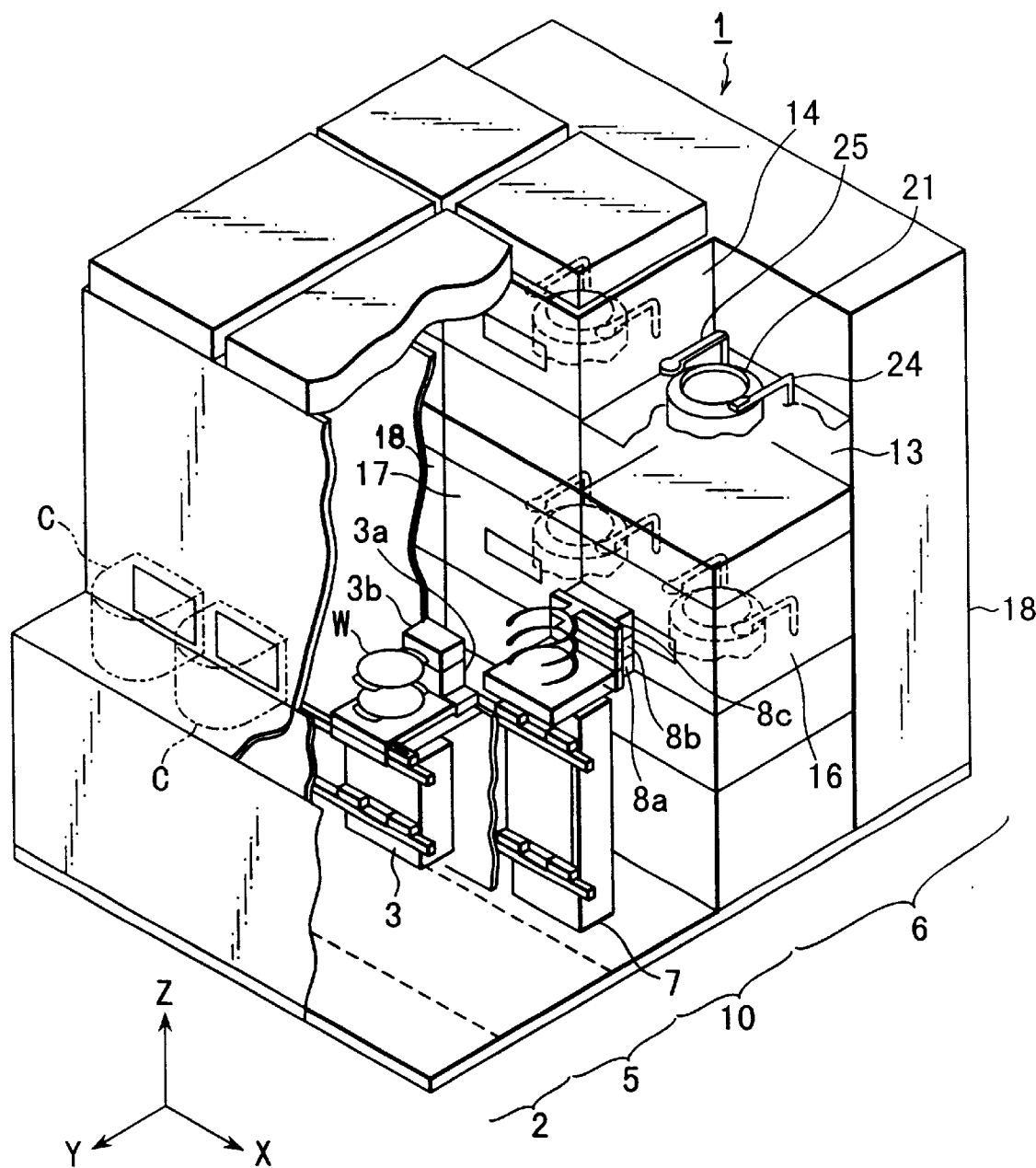
FIG. 5 is a partially-cut perspective view showing the inside portion of the cleaning system.

Similarly to the back-side rinsing nozzle 30, also the back-side scrubbing unit 31 incorporates a horizontal articular robot which is composed of a first arm 50 and a second arm 51 and which is capable of moving in a horizontal direction. A processing unit 52 is joined to the leading end of the second arm 51. A rotational shaft 54 which is rotated forwards/reversely by a rotating and lifting mechanism 53 is connected to the base portion of the first arm 50. When the rotating operation of the rotating and lifting mechanism 53 is switched, the processing unit 52 is able to reciprocate from at least the center of the back side of the wafer W to an arbitrary periphery in a direction of θ', as shown in FIG. 4.

When the rotating and lifting mechanism 53 performs a vertical operation, the processing unit 52 is vertically moved. Thus, switching can be performed between a state in which the processing unit 52 is in contact with the back side of the wafer W held by the spin chuck 20 and a state in which the processing unit 52 is moved downwards apart from the back side of the wafer W. The drawings show a state in which the operation of the rotating and lifting mechanism 53 has maximally upwards moved the back-side scrubbing unit 31 and thus the processing unit 52 has been brought into contact with the back side of the wafer W.

The processing unit 52 is provided with a processing member 55 in the form of a brush or made of sponge. The processing member 55 is joined to an upper portion of the rotational shaft 56 which is rotated by a motor (not shown) included in the second arm 51. A discharge port 57 for discharging, for example, pure water, which is process liquid, is opened in the central portion of the processing member 55. When the processing unit 52 is brought into contact with the back side of the wafer W, the rotating processing member 55 is brought into contact with the back side of the wafer W while pure water is discharged through the discharge port 57.

The atmospheres in the hollow portions in the processing container 21 and the rotating shaft 27 are exhausted by exhaust means (not shown), for example, external vacuum pumps. The process liquid with which the front side of the wafer W has been rinsed is discharged through a discharge pipe 60 disposed in the bottom portion of the processing container 21 and so forth. On the other hand, the process liquid with which the back side of the wafer W has been rinsed is discharged through the discharge pipe 60 of the processing container 21 and so forth.

Figure 14:
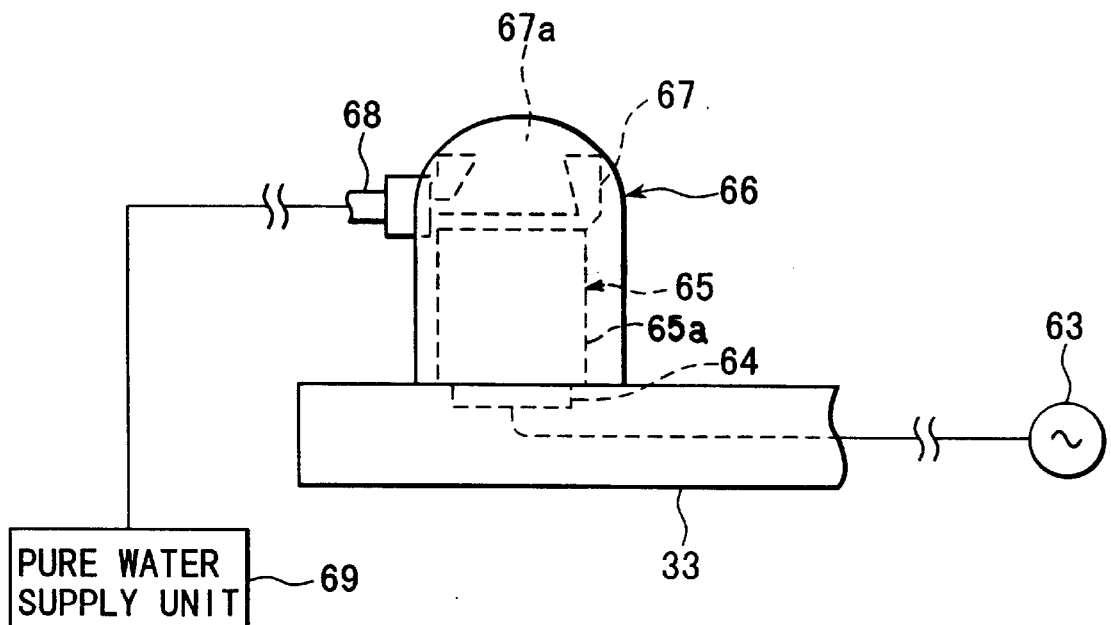
FIG. 14 is a schematic view showing the structure of an ultrasonic cleaning nozzle (a mega-sonic nozzle) which is a back-side cleaning means.

In place of the water jet nozzle 34, an ultrasonic cleaning nozzle (a mega-sonic nozzle) 66 shown in FIG. 14 may be employed. The ultrasonic cleaning nozzle 66 incorporates an oscillating unit 65 and a liquid discharging portion 67. The liquid discharging portion 67 incorporates a discharge port 67a allowed to communicate with a pure water source 69 through a tube 68. The oscillating unit 65 is joined to the back side of the discharge port 67a so that ultrasonic waves are applied to pure water discharged through the discharge port 67a. An electrode 64 is bonded to an oscillator 65a of the oscillating unit 65. Thus, when electric power is supplied from the power supply 63 to the electrode 64, ultrasonic waves having a frequency of several MHz are oscillated by the oscillator 65a. The water jet nozzle 34 and the ultrasonic cleaning nozzle 66 may be varied to correspond to the type of the cleaning process.

The process for cleaning both sides of the wafer W which is performed in the processing unit 13 will now be described.

The wafer W is placed and held on the support plate 28 of the spin chuck 20. That is, the holding member 29 presses the peripheral portion of the wafer W so as to hold the wafer W. Then, the motor 26 is started to rotate the rotating shaft 27. Thus, the wafer W is rotated.

High pressure pure water is discharged through the water jet nozzle 34 to the back side of the rotating wafer W. Then, the motor 35 is rotated so that the water jet nozzle 34 is allowed to reciprocate at least in a range from the center of the back side of the wafer W to an arbitrary peripheral portion of the same. As a result, high pressure pure water is supplied to the overall back side of the wafer W.

Since the back-side processing nozzle 30 is disposed in the hollow portion 27a of the rotating shaft 27, no impediment exists between the back side of the wafer W and the water jet nozzle 34. Therefore, the process liquid can always be supplied from the water jet nozzle 34 to the back side of the wafer W. Thus, the back side of the wafer W is covered with the film of the process liquid. As a result, the back-side processing nozzle 30 is able to effectively remove particles.

On the other hand, the rotating and lifting mechanism 53 performs the vertical moving operation so that the back-side scrubbing unit 31 is moved upwards. It leads to a fact that the processing unit 52 is brought into contact with the back side of the wafer W. The processing member 55 of the processing unit 52 is rotated in a state in which pure water is discharged from the processing unit 52 so that particles allowed to adhere to the back side of the wafer W are scraped off. In the state in which the processing unit 52 is in contact with the back side of the rotating wafer W, the rotating operation of the rotating and lifting mechanism 53 causes the processing unit 52 to reciprocate at least in a range from the center of the back side of the wafer W to an arbitrary peripheral portion of the same. The processing unit 52 of the back-side scrubbing unit 31 is uniformly brought into contact with the overall back side of the wafer W. Thus, the back side is rinsed.

Since the back-side scrubbing unit 31 is disposed in the hollow portion 27a in the rotating shaft 27, no object which obstructs the processing unit 52 exists in the locus of the processing unit 52. Therefore, the processing unit 52 is able to smoothly move in the rotating shaft 27. Thus, the back-side scrubbing unit 31 uniformly rinses the overall back side of the wafer W. Also the front side of the wafer W is rinsed by the front-side supply nozzle 24 and the front-side scrubbing unit 25.

After the rinsing process has been completed, supply of the process liquid from the back-side processing nozzle 30 is interrupted. On the other hand, the back-side scrubbing unit 31 is moved downwards by the downward moving operation of the rotating and lifting mechanism 53. Thus, the processing unit 52 is separated from the back side of the wafer W. Then, the spin chuck 20 is rotated at higher speed so as to remove the process liquid from the back side of the wafer W to dry the back side. At this time, also the front side of the wafer W is dried.

Then, the wafer W subjected to the process is discharged from the processing unit 13, and then moved to the processing unit 14. Then, the front and back sides of the wafer W are cleaned and dried in the processing units 14 and 15 similarly to the above-mentioned processes. Then, twenty four residual wafers W are sequentially processed similarly to the above-mentioned processes. Thus, the wafer W subjected to the process in the cleaning section 6 is again accommodated in the cassette C. When twenty five wafers W have been processed, the wafers W are, in cassette C units, discharged to the outside of the cleaning system 1.

The processing unit 13 according to this embodiment is able to uniformly rinse the wafers W while generation of a gas-liquid interface on the back side of the wafer W can be prevented. As a result, an effective cleaning process using the back-side processing nozzle 30 can be performed. Since also the back-side scrubbing unit 31 is disposed in the hollow portion 27a of the rotating shaft 27, the cleaning operation of the back-side scrubbing unit 31 is not obstructed. Thus, the back side of the wafer W can uniformly be cleaned. As a result, the effective cleaning process using the back-side scrubbing unit 31 can be performed. Since the front-side supply nozzle 24 and the front-side scrubbing unit 25 for rinsing the front side of the wafer W are provided, both of the front side and the back side of the wafer W can simultaneously be cleaned by one processing unit 13. Therefore, the processing time can be shortened and a necessity of providing a mechanism for reversing the wafer W can be eliminated. As a result, the overall size of the system can be reduced.

The processing unit 13 may be structured such that process liquid is, by the back-side processing nozzle, simultaneously supplied to the range from the center of the back side of the wafer W to an arbitrary periphery of the same.

Figure 15:
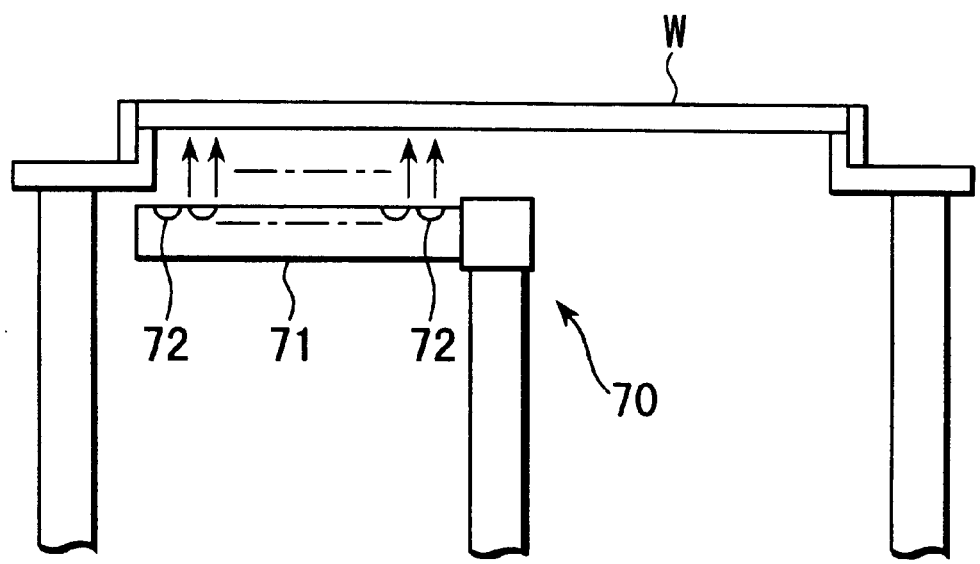
FIG. 15 is a perspective view showing the inside portion of another back-side cleaning means.
Figure 16:
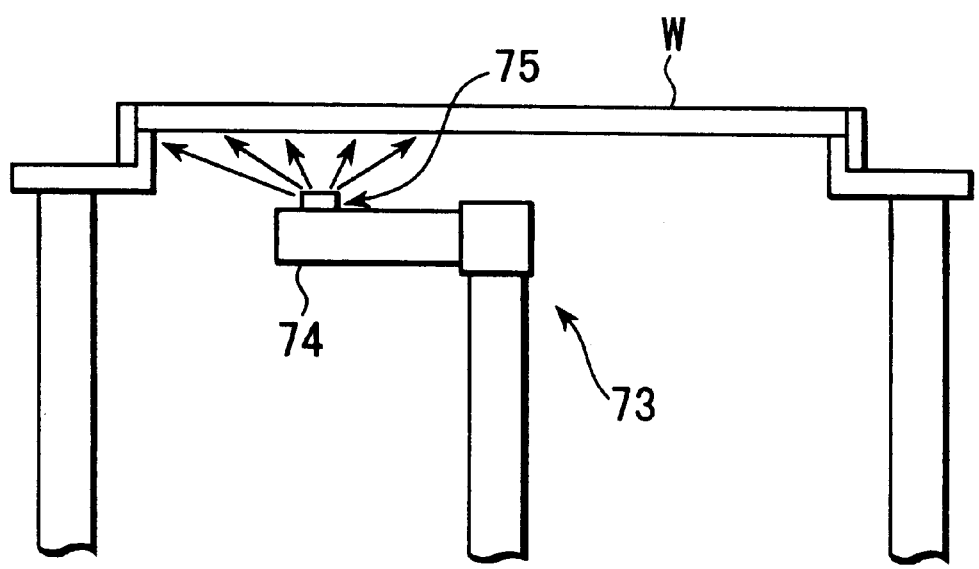
FIG. 16 is a perspective view showing the inside portion of another back-side cleaning means.

In an embodiment shown in FIG. 15, a back-side processing nozzle 70 incorporates a nozzle body 71 having a lengthwise width which is substantially the same as the radius of the wafer W. A plurality of discharge ports 72 are formed to correspond to at least the range from the center of the back side of the wafer W to an arbitrary periphery of the same on the upper surface of the nozzle body 71. Also, a plurality of nozzle bodies 71 may be disposed radially from the center of the back side of the wafer W.

The back-side processing nozzle 70 discharge process liquid through the plural discharge ports 72 of the nozzle body 71 thereof so as to simultaneously supply process liquid to at least the range from the center of the back side of the wafer W to an arbitrary periphery of the same. When the spin chuck 20 is rotated, process liquid is supplied to the overall back side of the wafer W. Thus, the back-side processing nozzle 70 is able to uniformly rinse the back side of the wafer W.

A structure may be employed in which the discharge portion is provided for the nozzle body so as to cause process liquid to simultaneously be supplied to at least the range from the center of the back side of the wafer W to an arbitrary periphery of the same. An embodiment shown in FIG. 16 has a structure that a back-side processing nozzle 73 has a discharge portion 75 provided for the nozzle body 74 thereof. Thus, process liquid is sprayed through the discharge portion 75 so as to simultaneously supply process liquid to at least the range from the center of the back side of the wafer W to an arbitrary periphery of the same. Depending on the type of the cleaning process, the back-side processing nozzle may be provided for the hollow portion 27a in the rotational shaft to clean the back side of the wafer W by only supplying process liquid. A structure may be employed which incorporates the scrubbing unit to rinse the back side of the wafer W by only the scrubbing operation.

Figure 17:
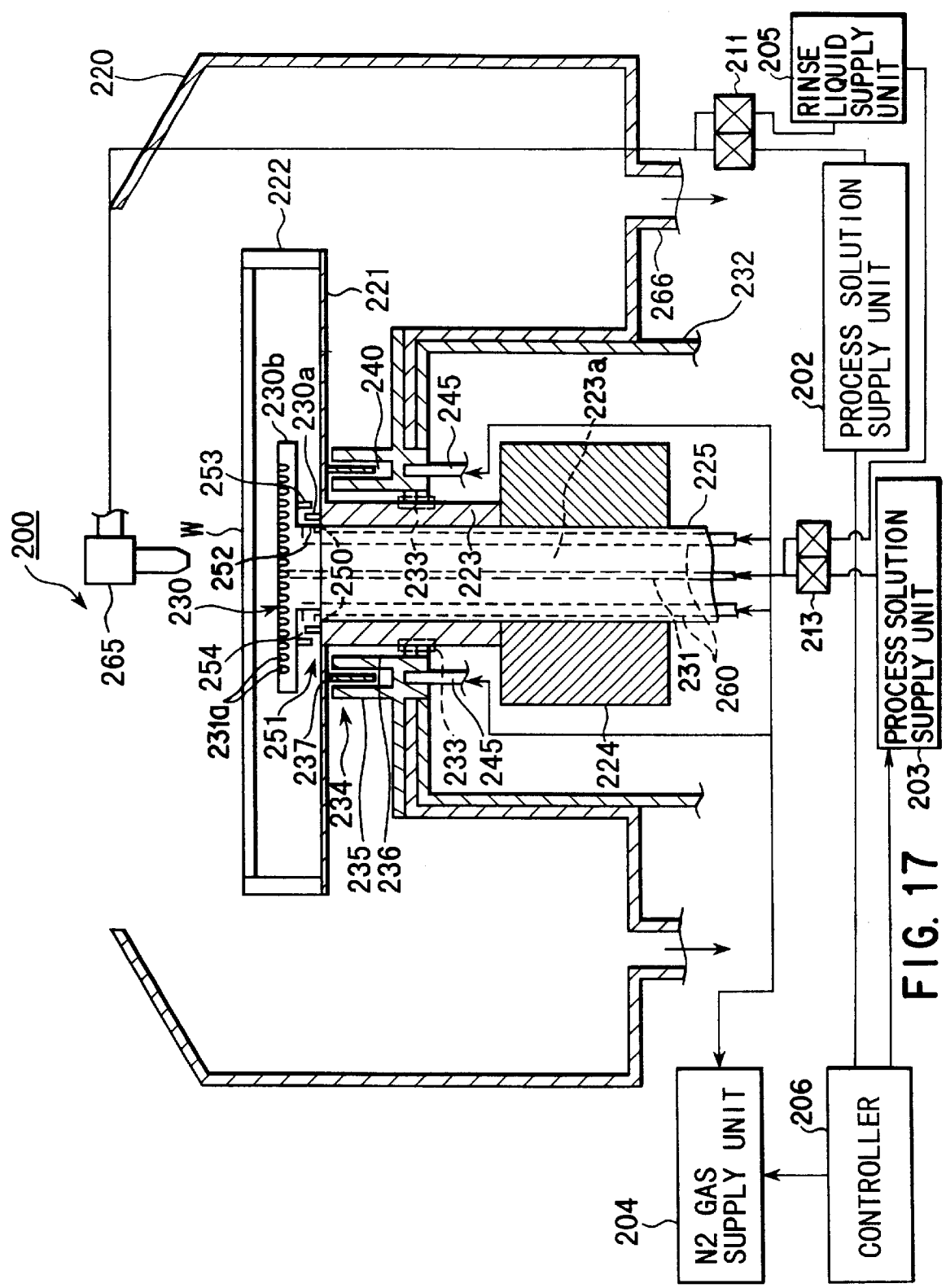
FIG. 17 is cross sectional view showing an apparatus for cleaning both sides of a substrate according to an embodiment of the present invention.
Figure 18:
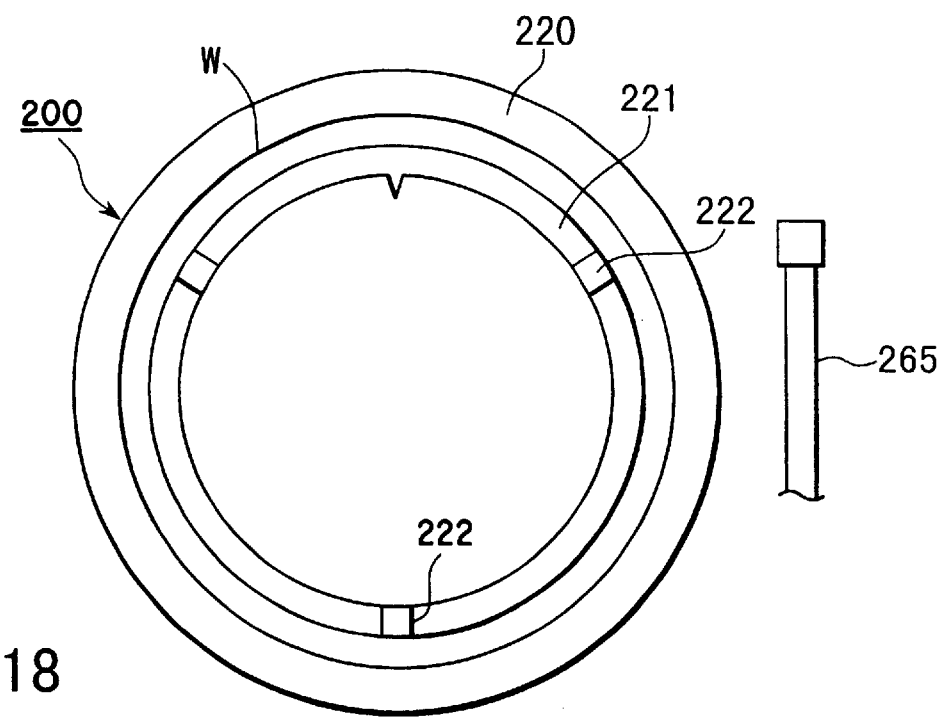
FIG. 18 is a plan view showing the apparatus for cleaning both sides of a substrate.
Figure 19:
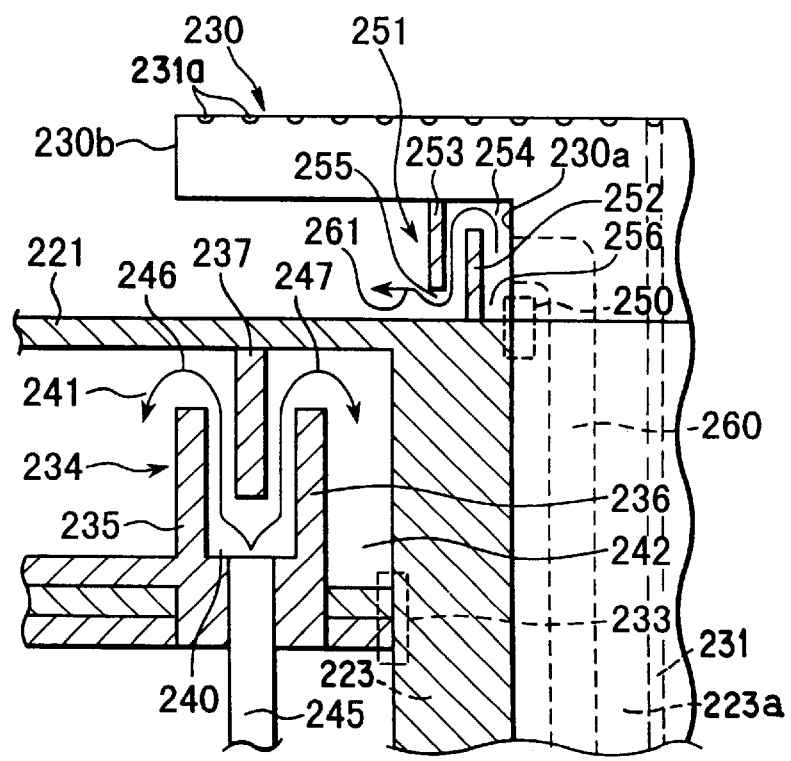
FIG. 19 is an enlarged cross sectional view showing an essential portion of the apparatus for cleaning both sides of a substrate.

Referring to FIGS. 17 to 19, a second embodiment of the present invention will now be described.

An apparatus 200 for cleaning both sides incorporates a cup 220 having an opened upper surface. The wafer W is arranged to be accommodated in the cup 220 through the upper opening in the cup 220.

A rotational table 221 is disposed in the cup 220. A holding portion 222 on the upper surface of the rotational table 221 has three mechanical chucks formed at angular intervals of 120° in a circumferential direction of the rotational table 221, the angular intervals of 1200 being intervals in a plan view. The holding portion 222 holds the wafer W as illustrated so that the holding portion 222 rotates the wafer W in cooperation with the rotational table 221. A support pin (not shown) for supporting the back side of the wafer W is vertically disposed on the upper surface of the rotational table 221.

The lower surface of the rotational table 221 is supported by a rotational shaft 223 having a hollow inside portion. A rotating mechanism 224 similarly having a hollow inside portion is joined to a lower portion of the rotational shaft 223. Therefore, when the rotating mechanism 224 is operated, the rotational table 221 can be rotated.

A support shaft 225 penetrates the rotational shaft 223 and the rotating mechanism 224. A supply nozzle 230 for supplying process liquid is disposed at the top end of the support shaft 225. The supply nozzle 230 incorporates a columnar portion 230a secured to the top end of the support shaft 225 and a disc portion 230b supported by the columnar portion 230a. The supply nozzle 230 has a T-like side view. In a state in which the supply nozzle 230 is in a static state, the supply nozzle 230 supplies process liquid to the back side of the wafer W which is rotated integrally with the rotational table 221. Note that the liquid discharge ports of the supply nozzle 230 are allowed to communicate with a process liquid supply unit 203 through a passage 231.

A portion of the rotational shaft 223 in a range from the rotating mechanism 224 to a position immediately before the rotational shaft 223 penetrates the container 220 is covered with a cover 232. Also the rotating mechanism 224 joined to the lower portion of the rotational shaft 223 is converted with the cover. To enhance airtightness of a portion 233 of the cover 232 and the container 220 which is penetrated by the rotational shaft 223, a cylindrical first labyrinth seal 234 is disposed around the rotational shaft 223. Thus, an atmosphere of a portion of the rotational shaft 223 in a range from a position at which the rotational shaft 223 projects over the cover 232 to a position at which the rotational shaft 223 supports the lower surface of the rotational table 221 is sealed by the first labyrinth seal 234.

As shown in FIG. 19, the first labyrinth seal 234 has a structure that two first upward partition plates 235 and 236 stood erect on the upper surface of the cover 232 running parallel with each other are disposed apart from each other for a predetermined distance. Moreover, a first downward partition plate 237 downwards projecting over the bottom surface of the rotational table 221 is disposed between the first upward partition plates 235 and 236. Thus, a first bypass passage 240 is formed in the first labyrinth seal 234. An outer port 241 of the first bypass passage 240 is opened, while an inner port 242 is closed by the bottom surface of the container 220 at a portion 233. The first bypass passage 240 has the above-mentioned structure. Therefore, the atmosphere of process liquid introduced through the port 241 cannot easily be discharged through the port 242. Moreover, dust or the like allowed to pass through a small gap in the portion 233 and generated when the rotating mechanism 224 is operated cannot easily be discharged from the port 242 to the port 241.

Moreover, a first $N_2$ gas-supply circuit 245 for supplying $N_2$ gas (nitrogen gas) which is inert gas is connected to the first labyrinth seal 234. An outlet port of the first $N_2$ gas-supply circuit 245 is opened in a space between the first upward partition plates 235 and 236 in the first bypass passage 240. As a result, a $N_2$ gas flow supplied from the first $N_2$ gas-supply circuit 245 collides with the first downward partition plate 237, causing the $N_2$ gas flow to be divided into two sections. One of the two sections upwards flows along the first upward partition plate 235 toward the port 241. Thus, an air flow 246 is generated which is jetted outwards from the first labyrinth seal 234. The other section forms an air flow 247 which upwards flows along the first downward partition plate 237 toward the port 242 and which flows downwards along the first upward partition plate 236. The air flow 246 serves as an air curtain for the port 241, while the air flow 247 serves as an air curtain for the port 242.

To enhance airtightness of a portion 250 in which the supply nozzle 230 projects over the upper surface of the rotational table 221, the atmosphere around the columnar portion 230a and in a range from the upper surface of the rotational table 221 to the lower surface of the disc portion 230b is sealed by a cylindrical second labyrinth seal 251 formed around the columnar portion 230a.

As shown in FIG. 19, the second labyrinth seal 251 has a structure that a second upward partition plate 252 stood erect on the upper surface of the rotational table 221 is disposed on the inside. Moreover, a second downward partition plate 253 projecting downwards over the lower surface of the disc portion 230b is disposed apart from the second upward partition plate 252 for a predetermined distance. As a result, a second bypass circuit 254 is formed in the second labyrinth seal 251. An outward port 255 of the second bypass circuit 254 is opened, while an inward port 256 is closed by the upper surface of the rotational table 221 at a portion 250. In the second bypass circuit 254 having the above-mentioned structure, the atmosphere of process liquid introduced through the port 255 cannot easily be leaked to the outer port 256 in the same manner as the first labyrinth seal 234.

Moreover, a second $N_2$-supply circuit 260 penetrating the support shaft 225 and the supply nozzle 230 is connected to the second labyrinth seal 251. In addition, an outlet portion of the second labyrinth seal 251 is, in the second bypass circuit 254, opened in a space on the inside of the second upward partition plate 252. As a result, the $N_2$ gas supplied from the second $N_2$-supply circuit 254 forms an air flow 261 which upwards flows along the second upward partition plate 252 in a direction from the port 256 to the port 255. Then, the air flow 261 downwards flows along the second downward partition plate 253. The air flow 261 serves as an air curtain for the port 255.

Moreover, a supply nozzle 265 for supplying process liquid mainly composed of a chemical solution component to the surface of the wafer W accommodated in the container 220 is disposed above the container 220. The supply nozzle 265 is structured to be movable above the container 220. Process liquid removed from the back side of the wafer W by dint of the rotation of the wafer W is discharged through a discharge pipe 266 disposed in the bottom portion of the container 220. Thus, the atmosphere in the container 220 is exhausted by an exhaust means (not shown) provided for the bottom portion of the container 220.

Also the processing units 7 to 11 have the same structure as that of the processing unit 6. In each of the processing units 7 to 11, various process liquid is used to rinse and dry the wafers W.

As shown in FIG. 17, the wafer W is rotated by operating the rotating mechanism 224. The supply nozzle 265 is moved to a position above the wafer W to the front side of the wafer W so that the front side of the wafer W is sequentially supplied with the chemical solution and pure water which are process liquid. On the other hand, the back side of the wafer W is supplied with the process liquid such that the stationary supply nozzle 230 disposed in the central portion of the rotational table 221 upwards supplies process liquid to the back side of the wafer W. Thus, process liquid is supplied to the front side and the back side of the wafer W while the wafer W is rotated. Centrifugal force is used to uniformly supply process liquid to the front side and back side of the wafer W.

In the foregoing case, rotation of the rotating mechanism 224 results in generation of fine dust and so forth in the cover 232. Thus, rotation of the wafer W causes the atmosphere of process liquid to be filled with splashes of process liquid in the container 220. Therefore, the rotational shaft 223 and the cover 232 are covered with the splashes as shown in FIG. 17. Thus, the atmosphere of the position at which the rotating mechanism 224 is disposed and the atmosphere in the container 220 are insulated from each other. Thus, communication between the atmospheres can be prevented. Moreover, the atmosphere in the vicinity of the portion 233 of the cover 232 and the container 220 which is penetrated by the rotational shaft 223 is sealed by the first labyrinth seal 234. Thus, the airtightness of the portion 233 is enhanced. Therefore, dispersion of fine dust in the cover 232 into the container 220 through the portion 233 can be prevented. Moreover, leakage and dispersion of the splashes and the atmosphere of the process liquid in the container 220 into the cover 232 can be prevented.

Specifically, the first bypass passage 240 is formed in the first labyrinth seal 234 as shown in FIG. 19. Thus, communication of the atmosphere of process liquid from the port 241 to the port 242 and that of dust and so forth from the port 242 to the port 241 can be prevented. Moreover, the first $N_2$ supply circuit 245 supplies the $N_2$ to the first bypass passage 240. Thus, the air flow 246 is formed in a direction opposite to a direction into which the atmosphere of process liquid is introduced. Moreover, the air flow 247 is formed in a direction opposite to the direction into which dust and so forth are introduced. As a result, introduction of the atmosphere of process liquid and dust and so forth into the first labyrinth seal 234 can be prevented.

Moreover, the atmosphere adjacent to the portion 250 in which the supply nozzle 230 projects over the rotational table 221 is sealed by the second labyrinth seal 251. Thus, the airtightness of the portion 250 is enhanced. Therefore, undesirable introduction of splashes of process liquid in the container 220 into the support shaft 225 through the portion 250 to leak into the cover 232 can be prevented.

The second bypass circuit 254 is formed in the second labyrinth seal 251, as shown in FIG. 19. Thus, communication of the atmosphere of process liquid from the port 255 to the port 256 can be prevented. Moreover, $N_2$ gas is supplied from the gas supply unit 204 to the second bypass circuit 254 through the second $N_2$-supply circuit 260. Thus, an air flow 261 is formed in a direction opposite to a direction in which the atmosphere of process liquid is introduced. As described above, undesirable introduction of the atmosphere of process liquid into the second labyrinth seal 234 can be prevented.

When predetermined time has elapsed, the rinsing process is completed. Then, the rotational speed of the rotating mechanism 224 is raised to enlarge the centrifugal force. The centrifugal force removes process liquid allowed to adhere to the wafer W so that the wafer W is dried. After the process has been completed, the operation of the rotating mechanism 224 is interrupted. Also the rotation of the rotational table 221 is interrupted. Then, the wafer W is discharged from the inside portion of the processing apparatus 200, and then moved to another processing apparatus.

The processing apparatus 200 according to this embodiment can be prevented dispersion of fine dust in the cover 232 into the container 220. Moreover, leakage and dispersion of the splashes and the atmosphere of process liquid in the container 220 into the cover 232 can be prevented. Therefore, the atmosphere in the container 220 and the atmosphere at the position of the rotating mechanism 224 can be insulated from each other. Thus, adhesion of particles to the wafer W can be prevented and thus a breakdown of the rotating mechanism 224 can be prevented.

The present invention is not limited to the description of the above-mentioned embodiments and a variety of modifications are permitted. For example, only either of the first labyrinth seal 234 or the second labyrinth seal 251 may be provided. Moreover, the substrates are not limited to the wafers W according to the foregoing embodiments. The substrates may be LCD substrates, glass substrates, CD substrates, photomask, printed circuit substrates or ceramic substrates.

Additional advantages and modifications will readily occurs to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An apparatus for cleaning both sides of a substrate, comprising:

a spin chuck for holding a substrate such that contact with at least a central portion of the substrate is prevented;

a servo motor having a hollow drive shaft connected to said spin chuck to transmit rotational force to said spin chuck;

front-side cleaning means for cleaning a front side of the substrate held by said spin chuck;

back-side cleaning means for cleaning a back side of the substrate held by said spin chuck, wherein said back side of the substrate held by said spin chuck through hollow portions of said hollow shaft; and a cover for covering at least a portion of said hollow shaft and a first sealing portion for sealing a portion between said cover and said spin chuck.

2. An apparatus according to claim 1, further comprising:

a second sealing portion for sealing a portion between said spin chuck and said back-side cleaning means.

3. An apparatus for cleaning both sides of a substrate, comprising:

a rotational table having a holding portion for holding a substrate such that contact with at least a central portion of the substrate is prevented;

a hollow rotating shaft connected to a lower portion of said rotational table and rotatively supporting said rotational table;

front-side cleaning means for cleaning a front side of the substrate held by said rotational table;

back-side cleaning means for cleaning the back side of the substrate held by said rotational table, said back-side cleaning means having a nozzle disposed to face the back side of the substrate held by said rotational table through a hollow portion of said rotting shaft;

a process liquid supply unit for supplying process liquid to said nozzle;

a cover for covering said hollow rotating shaft;

a pair of upward labyrinth members joined to said cover such as to extend upward from said cover; and a downward labyrinth member joined to said rotational table such as to extend downward from said rotational table and inserted between said pair of upward labyrinth members situated such as to create a gap between each of the upward labyrinth members and downward labyrinth member.

4. An apparatus according to claim 3, further comprising:

fluid supply means for supplying fluid to said gap formed between said pair of upward labyrinth members and said downward labyrinth member.

5. An apparatus for cleaning both sides of a substrate, comprising:

a rotational table having a holding portion for holding a substrate such that contact with at least a central portion of the substrate is prevented;

a hollow rotating shaft connected to a lower portion of said rotational table and rotatively supporting said rotational table;

front-side cleaning means for cleaning a front side of the substrate held by said rotational table;

back-side cleaning means for cleaning the back side of the substrate held by said rotational table, said back-side cleaning means having a nozzle disposed to face the back side of the substrate held by said rotational table through a hollow portion of said rotating shaft;

a process liquid supply unit for supplying process liquid to said nozzle;

a cover for covering said hollow rotating shaft;

an upward labyrinth member joined to said rotational member such as to extend upward from said rotational member; and a downward labyrinth member joined to said nozzle such as to extend downward from said nozzle and situated such as to create a gap between the upward labyrinth member and the downward labyrinth member.

6. An apparatus according to claim 5, further comprising:

fluid supply means for supplying fluid to said gap formed between said upward labyrinth member and said downward labyrinth member.

* * * * *